(12) United States Patent
Demars et al.

(10) Patent No.: US 6,656,665 B1
(45) Date of Patent: Dec. 2, 2003

(54) METHOD FOR PRODUCING A PATTERN ON A TRANSPARENT SUBSTRATE

(75) Inventors: Yves Demars, Clermont (FR); Jean-Christophe Elluin, Choisy Au Bac (FR); Gilles Longchampt, Le-Plessis-Brion (FR)

(73) Assignee: Saint-Gobain Vitrage, Courbevoie (FR)

(*) Notice: Subject to any disclaimer, the term of this patent is extended or adjusted under 35 U.S.C. 154(b) by 113 days.

(21) Appl. No.: 09/714,991

(22) Filed: Nov. 20, 2000

Related U.S. Application Data

(62) Division of application No. 09/118,816, filed on Jul. 20, 1998, now Pat. No. 6,183,939.

(30) Foreign Application Priority Data

Jul. 18, 1997 (FR) .............................. 97 09187

(51) Int. Cl.⁷ .............................. G03F 7/00; B32B 27/16
(52) U.S. Cl. .............................. 430/322; 430/7; 430/16; 430/18; 430/26; 430/198; 430/291; 430/324; 430/330; 428/195; 428/204; 428/206; 428/426
(58) Field of Search ................................. 430/322, 324, 430/330, 7, 16, 18, 26, 198, 291; 428/206, 195, 204, 426

(56) References Cited

U.S. PATENT DOCUMENTS

| | | | | |
|---|---|---|---|---|
| 4,247,612 A | * | 1/1981 | Nishizawa et al. | ............ 430/28 |
| 4,454,167 A | | 6/1984 | Bernot et al. | ................. 427/96 |
| 4,929,493 A | | 5/1990 | Tünker | ....................... 428/207 |
| 5,086,695 A | | 2/1992 | Czeczota | ................... 101/129 |
| 5,549,929 A | * | 8/1996 | Scheibelhoffer et al. | .... 427/282 |
| 5,562,951 A | | 10/1996 | Kamen | ........................ 427/493 |
| 5,640,066 A | * | 6/1997 | Itou et al. | ................... 313/461 |
| 5,750,295 A | * | 5/1998 | Kim et al. | .................... 430/25 |
| 5,955,226 A | * | 9/1999 | Matsuda et al. | ............... 430/25 |

FOREIGN PATENT DOCUMENTS

| | | |
|---|---|---|
| DE | 26 10 213 | 9/1977 |
| EP | 0 074 314 | 3/1983 |
| EP | 0 300 300 | 1/1989 |
| EP | 0 327 436 | 8/1989 |
| EP | 0 394 936 | 10/1990 |
| FR | 2 167 375 | 8/1973 |
| FR | 2 736 348 | 1/1997 |
| GB | 2 013 915 | 8/1979 |

OTHER PUBLICATIONS

Chemical Abstracts, vol. 104, No. 14, Apr. 7, 1986, Columbus, Ohio; abstract no. 119835 Huang, Jianxing et al: XP002061419 & Hauxue Tongbao, vol. 10, 1985, Peking CN, pp. 11–12.

* cited by examiner

*Primary Examiner*—Mark F. Huff
*Assistant Examiner*—Nicole Barreca
(74) *Attorney, Agent, or Firm*—Pennie & Edmonds LLP

(57) ABSTRACT

The invention concerns a method for producing a pattern on a transparent substrate, particularly a glass or glass-ceramic substrate.

According to the invention, there is deposited on at least one area of one face of the substrate, a first layer of a photosensitive resin comprising at least one sensitizing agent and at least one photosensitive compound essentially composed of a polymer with an average degree of cross-linking d° such that it is able to absorb solid particles. Certain areas of said first layer are exposed to light, particularly in order to increase, in a controlled manner, the average degree of cross-linking do of said polymer so as to modulate its absorption capacity. On the first layer is deposited at least one second layer of a mineral-particle-based composition. The substrate is subjected to at least one treatment cycle, particularly in order to fix said mineral particles.

The invention also concerns the substrate produced by this method and its applications.

17 Claims, No Drawings

METHOD FOR PRODUCING A PATTERN ON A TRANSPARENT SUBSTRATE

This is a division of application Ser. No. 09/118,816 filed on Jul. 20, 1998 now U.S. Pat. No. 6,183,939.

BACKGROUND OF THE INVENTION

This invention concerns a method for producing a pattern on a transparent substrate, particularly a glass or glass-ceramic substrate, and also a substrate produced by this method.

It is well known from the prior art to use enamels to produce a decorative pattern on a glass or glass-ceramic substrate.

The enamels used for this application are generally obtained from what is known as an enamel composition, comprising a powder essentially composed of at least one glass frit (which acts as a vitreous matrix) and pigments as colorants in particular, the glass frit and the pigments being metal-oxide-based, and a medium permitting the application of the enamel composition to the substrate and its temporary adhesion thereto. The medium selected, depending on the intended use of the enamel, must ensure the satisfactory placing in suspension of the frit particles and pigment particles used and must be consumed during the baking of the enamel. This medium can include solvents, diluents, oils, resins, etc.

It is known to deposit these enamels by various printing techniques, most particularly by screen-printing techniques using a fabric whose mesh count and mesh openings depend on the pattern to be produced. These printing techniques are very advantageous from an economic point of view, in that they can be used for high-speed mass production. In addition, they are very well suited to the reproduction of large-sized decorative patterns on substrates of the types used by glassmakers.

These techniques are not completely satisfactory, however, particularly in terms of flexibility of use and esthetics.

First, in order to change the pattern for reproduction it is necessary to change the screen-printing cloth, which is tedious in industrial operations, especially in "personalized" small-series production.

Second, the screen-printing technique itself leaves a grid that betrays the original visible in the decorative pattern. Visually, the substrate provided with the gridded pattern has something of the appearance of a piece of fabric.

It is also known from the prior art, for decorative applications on a substrate made of any desired material, particularly the formation of a colored visible image, to use photosensitive resins as vehicles for pigments or colorants.

For such applications, it is known to employ two different approaches to the use of these photosensitive resins.

The first approach consists in incorporating the desired ingredient (pigment or colorant) directly into the composition containing the photosensitive resin, then exposing the resin through a positive or negative plate by means of a UV lamp, and finally stripping [it] with an appropriate solvent to produce an insoluble image containing said ingredient on the substrate.

Moreover, this stripping step is cumbersome and complex, especially since it is necessary to find a perfect affinity between the solvent used and the resin and to master the operating conditions, especially with respect to duration.

The second approach consists in first exposing the photosensitive resin in the same manner as above, then causing the pigment(s) to be absorbed directly by the portions of said resin not exposed to light, and finally stripping the resulting system with an appropriate solvent.

Apart from the fact that these two approaches have in common that they are not suitable for large decorative patterns, most particularly because it is difficult to achieve an even distribution of the pigments over the entire surface of the substrate, they also have the major disadvantage of not yielding long-lasting products, since the pigments or colorants tend to separate from the substrate.

SUMMARY OF THE INVENTION

The aim of the invention is, therefore, to correct the aforesaid disadvantages, and in particular to propose a new method for producing a pattern on a transparent substrate, particularly a glass or glass-ceramic substrate, adaptable to both small- and large-scale production, and yielding a particularly esthetic, very-high-definition, durable pattern with no adverse effect on production cost.

To accomplish this aim, the object of the invention is a method for producing a pattern on a transparent substrate, particularly a glass or glass-ceramic substrate.

According to the invention, the following steps are performed, particularly in succession:

a) On at least one area of one face of the substrate is deposited a first layer of a photosensitive resin comprising at least one sensitizing agent and at least one photosensitive compound essentially composed of a polymer with an average degree of cross-linking $d°$ such that it is able to absorb solid particles, b) Certain areas of said first layer are exposed to light, particularly in order to increase, in a controlled manner, the average degree of cross-linking do of said polymer so as to modulate its absorption capacity, c) On said first layer is deposited at least one second layer of a mineral-particle-based composition, d) Said substrate is subjected to at least one treatment cycle, particularly in order to fix said mineral particles.

DETAILED DESCRIPTION OF THE INVENTION

Within the context of the invention, "pattern" is understood to mean anything capable of modifying the appearance and/or structure of the bare transparent substrate, whether by imparting to it a particular effect; by lending it an ornamental appearance in the form of an illustration, optionally for purposes of identification; or by providing it with other functions. Some of these other functions will be itemized hereinbelow.

In the context of the invention, "mineral particles" is understood to mean any reflective mineral element whose index of refraction is very different from that of the bare transparent substrate.

Similarly, it should be understood that at least one portion of the "mineral particles" modifying the appearance and/or structure of the bare transparent substrate serves as a binding agent whose melting point is below the temperature to which the substrate is exposed.

The step of "fixing of the mineral particles" —Step d) according to the invention—can be temporary or final, depending on the type of treatment which the substrate is to undergo.

Thus, temporary fixing is achieved, for example, by ultraviolet (UV) treatment, which hardens the entire layer of photosensitive resin deposited.

This type of treatment furnishes a number of advantages.

Since the substrate becomes easy to handle, it can be transported before the final fixing of the mineral particles according to the invention.

Furthermore, this treatment makes it possible to achieve absolute surface evenness of the layer of photosensitive resin, which may prove necessary in particular if another layer of the same type is superimposed, as will be described hereinbelow.

Similarly, the final fixing of the mineral particles can be accomplished by means of a heat treatment cycle. In this case, it is the above-cited portion serving as a binding agent that melts during this same heat treatment cycle.

Obviously, as will be described hereinbelow, a variant of the invention can consist in that all the mineral particles melt during the heat treatment cycle of Step d).

Such is the case, for example, with a so-called low-melting-point glass frit, i.e., one whose melting point is below the temperature of deformation of the substrate, i.e., in most cases less than 750–800° C., generally below 650° C.

In this particular case a decorative pattern with a sandy effect is obtained (the glazed surface being more or less diffusive).

It should be noted at the outset that within the context of the invention, "glassfrit" is understood to mean a substantially transparent, vitrifiable composition in the form of a pigment-free, metal-oxide-based powder.

According to the invention, the phrase "a polymer with an average degree of cross-linking d° such that it is able to absorb solid particles" means that a polymer is selected whose network is initially loose so that the mineral particles can be inserted temporarily. In other words, this ensures satisfactory compatibility between the interstices in the network of the polymer and the size of the particles selected.

When the exposure to light is performed selectively, the network is rendered more or less dense in the areas concerned, which then become more or less leaktight, so to speak, to the mineral particles.

The principal advantage of thus depositing a mineral-particle-based composition by a photosensitization technique, compared to pressure deposition techniques of the kind used in screen printing, lies in the fact that the quantity of mineral particles, as previously defined, can be varied in a uniform manner over the entire glazed surface concerned. This results in the production of a particular decorative pattern, an effect that could never be achieved with the pressure techniques, in which all points in the pattern are necessarily of the same intensity. Moreover, no trace of gridding appears in the decorative pattern.

An advantageous consequence of the method according to the invention is that it is easy to implement and is low-cost in terms of money and time, since the operating conditions require no special precautions apart from solid mastery of Step b) involving the exposure to light, in order to obtain the desired variation of the absorption capacity of the polymer, and thus to achieve gradations within the gray scale by modifying the quantity of mineral particles absorbed.

Secondarily, the method according to the invention makes it possible to "personalize" the decorative pattern as desired, without the need for lengthy and painstaking preparation of a specialized tool or tools—no small advantage in an industrial setting.

The sensitizing agent selected is preferably a benzothiazole or naphthothiazole derivative, or optionally, to broaden spectral sensitivity, an anilinovinyl heterocyclic ammonium salt. Further, said sensitizing agent is preferably 1-N (methylbenzothiazolylidene)methyl dithioacetate.

When this sensitizing agent is used in combination with the polymer as defined above, its sensitivity interval is extended to a wavelength of about 0.5 micron, i.e., beyond the ultraviolet range (the upper limit of which is 0.38 $\mu$m). Thus it is no longer necessary to select a highly specialized radiation source in order to perform Step b).

Advantageously, the polymer that has proven to be the most appropriate for absorbing the finely ground mineral particles is ethylene-glycol and butanediol polycynamylidene malonate.

Three variants can be envisioned for the performance of Step b) of the method according to the invention:

According to the first variant, the exposure to light is effected by means of a radiation source, particularly an ultraviolet source, that illuminates the entire surface of a plate reproducing the decorative pattern and superimposed on the first layer, According to the second variant, the exposure to light is effected by the projection of an image, According to the third preferred variant, the exposure to light is effected by means of a point radiation source, particularly an ultraviolet point radiation source, preferably a laser, whose beam sweeps certain areas of the first layer.

With this third preferred variant it is possible to have very pronounced gradations at highly localized sites within the pattern, since the exposure to light is effected point by point. In addition, it is possible to "guide" the laser by means of a programmable logic unit according to the decorative pattern to be produced, which confers flexibility of use when the method according to the invention is used in an industrial production line.

According to a highly advantageous characteristic, the choice of the size of the mineral particles, which is adapted primarily to the absorption capacity of the polymer as noted above, is guided by the thickness of the first layer in such a way that the diameter of the particles is less than or equal to this thickness.

For this purpose, the mineral particles are ground very finely, the grind being finer, the higher the desired contrast between the different portions of the decorative pattern and/or the desired resolution of the pattern. Thus, a lower particle diameter $d_{90}$ of 10 $\mu$m or less, preferably between 4 and 8 $\mu$m, is especially preferred, since it corresponds well to the different thicknesses of the layers of photosensitive resin once they have been deposited and dried.

Similarly, the particle diameter $d_{10}$ selected is preferably between 0.2 $\mu$m and 1 $\mu$m, and, further, diameter $d_{50}$ is preferably between 1 $\mu$m and 4 $\mu$m. It will be recalled that these terms, "$d_{90}$," "$d_{50}$" and "$d_{10}$," signify that respectively 90%, 50% and 10% of the mineral particles in question have a diameter smaller than the indicated value. The $d_{90}$ value gives a clear idea of the size of the particles. In conjunction with the values of $d_{10}$ and/or $d_{50}$, it provides a complete picture of the particle size distribution within a given range of diameters.

In regard to Step d), the substrate is preferably subjected to a heat treatment cycle for the mineral particles, at temperatures equal to or greater than the melting points of these particles, particularly between 300 and 750° C., and further, preferably in the vicinity of 620° C.

In any event, the photosensitive resin should be eliminated at temperatures below those required to melt the mineral particles.

The aforesaid heat treatment cycle is advantageously part of a quenching, annealing or bending cycle.

The fixing temperature of the mineral particles thus is utilized to impart a specific mechanical strength to the glass substrate.

Before this particle-fixing heat treatment cycle, the substrate can be subjected to a first heat treatment cycle to burn off the photosensitive resin.

This first heat treatment cycle is especially advantageous since it completely prevents any "blistering" of the resin. This ensures preservation of the integrity, and in particular the contours, of the patterns after the heat treatments.

This secondary heat treatment is advantageously performed at a temperature on the order of 350° C., for a period of about 6 minutes per $\mu$m of thickness of the first layer. Depending on the desired type of modification of the appearance and/or structure of the bare transparent substrate, the mineral-particle-based composition can comprise a metal powder and/or a ceramic powder and/or a metal-oxide-based powder and/or functional particles of the liquid-crystal or phosphorus-particle type. The metal powder can be silver, gold or ruthenium oxide powder.

The liquid crystals will be selected by one skilled in the art according to the color of the pattern to be produced, depending, for example, on the nature of these crystals and the angle at which they are viewed by the observer. In the case of a "mixed" powder comprising a metal powder with a metal-oxide powder, the latter advantageously serves as a binding agent.

When an ornamental appearance is the primary consideration, the mineral-particle-based composition preferably comprises an enamel composition containing at least one glass frit.

The choice of the enamel composition is within the compass of those skilled in the art, who will adapt said composition depending on the substrate, particularly its nature and thickness.

In a known manner, the glass frit contains forming oxides to form the essential constituents of the vitreous material, modifying oxides able to modify this vitreous matrix and capable of affecting the melting point, and intermediate oxides that act as forming and/or modifying oxides, depending on their environment and their proportions.

Based on the quantity of modifying oxides and on the ratios between the intermediate and the forming oxides, one skilled in the art will choose the enamel composition having the temperature characteristics suited to the invention.

According to an advantageous characteristic of the invention, the glass frit includes the following constituents, in proportions by weight:

| | |
|---|---|
| PbO | 40–75% |
| ZnO | 0–7% |
| $Al_2O_3$ | 0–5% |
| $SiO_2$ | 1–35% |
| $ZrO_2$ | 1–5% |
| $B_2O_3$ | 0–10% |
| $K_2O$ | 0–0.2% |
| BaO | 0–0.2% |
| SrO | 0–0.2% |

According to a preferred variant of the invention, and when a decorative pattern formed by a visible image is desired, pigments, preferably of a single color shade, are added to the enamel composition before it is deposited.

In this preferred configuration, the enamel is used, astutely, as a binding agent. This is possible because the enamel creates a vitreous matrix which is ideal for unifying the pigments with the glass substrate in a durable manner.

According to the invention, it is preferable to add the pigments in proportions such that the ratio by weight between the glass frit and the pigments is between 50:50 and 90:10, preferably between 70:30 and 60:40, per 100 parts of frit-pigment mixture.

To obtain the best possible homogeneity between the pigments and the glass frit, the particle size of the pigments is advantageously selected so that it is roughly equal to that of the glass frit. The diameter of the pigments [the pigment particles] is preferably less than 10 $\mu$m, particularly between 1 and 5 $\mu$m.

When a metallized appearance is desired for the decorative pattern, it is preferable for mica pigments to be the majority constituent.

When a very-high-definition polychrome image is desired, according to the invention Steps a), b) and c) are performed n times in succession on the same area, with the alternating deposition of a hydrophilic resin and a hydrophobic resin, the n enamel compositions being notable in that each of them contains, as its majority constituent, black or white pigments or pigments that impart a single color.

According to this variant, when a four-color image is desired (n=4), the four enamel compositions together include black pigments as their majority constituent and impart the three primary colors each of them including as its majority constituent black pigments or pigments that impart only one of the three primary colors.

With regard to the formulation of the pigments, the white pigment selected is preferably titanium oxide $TiO_2$.

Similarly, for pigments imparting the primary color blue (cyan), $Co_3O_4$ pigments are advantageously selected. Finally, for pigments imparting the primary colors red (magenta) and yellow, the preferable choice is cadmium oxide CdO pigments mixed with cadmium sulfoselenide pigments, the relative proportions of which are modulated to obtain one (red) or the other (yellow) of the primary colors.

According to this same variant, the first photosensitive resin deposited is advantageously hydrophilic.

The invention relates not only to the method for producing the decorative pattern described hereinabove, but also to a transparent substrate, particularly a glass or glass-ceramic substrate, comprising on one of its faces at least one enameled area reproducing a decorative pattern.

This substrate is notable for the fact that in the enameled area it has a strictly positive light transmission coefficient, particularly of between 0.05 and 90% for an enameled layer with a thickness of less than 10 $\mu$m, preferably less than 5 $\mu$m. Such a substrate is particularly advantageous because if the decorative pattern can be viewed from both sides, its range of application is much broader than that of existing enameled substrates. Furthermore, the decorative pattern is visible from a very great distance.

The resolution of the decorative pattern is preferably higher than 15 d.p.i. (dots per inch), advantageously higher than 150 d.p.i.

The decorative pattern can be a monochrome or polychrome visible image, particularly a four-color image, and when this is the case the resolution of the image is as stated in the foregoing. Such fineness enables the image to be viewed at a plurality of distances, which means that two observers disposed at different distances from the substrate will distinguish different details of the image.

The invention is applicable to the manufacture of any high-resolution decorative glass product, such as a glass-covered luminous sign, a glass oven door with an oven molding[1], a display window, an interior partition, a stained-glass window. The glass product according to the invention can also be combined with another glass product by dividing it into sheets to lend it specific properties. This other glass product can be, for example, a transparent substrate coated with thin layers that provide it with a highly specialized functionality, such as an antireflective, non-fogging, or dirt-repelling function.

[1]TRANSLATOR'S NOTE: French bandeau de cuisiniere. The term is unknown to us. "De cuisiniere" could also be translated as "cook's"; bandeau could also be "strip" or "band".

The invention is also applicable to the manufacture of "fronts" for emittive screens in the nature of flat screens such as plasma screens.

A plasma screen is composed of two glass substrates superimposed on each other, constituting the front and back of the screen.

Although the screen-printing technique is completely suitable in terms of precision for depositing the components of the "back", and more particularly the luminophores and the silver-paste-based electrodes, it is not necessarily adequate for depositing the components of the front, by the very fact that these components must be disposed in virtually perfect opposite alignment with like elements on the back.

The high resolution provided by the aforesaid method of the invention, on the other hand, is perfectly adapted to this task.

For example, the technique according to the invention can be used to deposit, opposite each luminophore of the back, a selective colored filter of the desired wavelength produced from a ceramic powder optionally mixed with a low-melting-point glass frit.

It is also possible to deposit silver-paste-based electrodes which must be absolutely perpendicular to those of the back.

Finally, to improve the luminous efficiency of the plasma screen, luminophores which were difficult to deposit heretofore can be deposited as readily in very fine layers on the front.

Other details and advantageous characteristics will emerge hereinafter from the following nonrestrictive example according to the invention.

A solution containing 120 g/liter of a photosensitive resin is prepared in inactinic light.

For this purpose, first, 150 g of the ethylene-glycol and butanediol polycynamylidene malonate, with a density of d=1.237, are ground and then dissolved in 1 liter of a first solvent containing, respectively, 53% toluene, 21% butyl acetate and 26% 2-methoxyethyl acetate.

4.5 g of a sensitizer which is 1-N(methylbenzothiazolidene)methyl dithiocetate are also ground and are then dissolved to saturation in a second solvent containing 30% butyl acetate and 70% 2-methoxyethyl acetate; the solution as a whole is then filtered and added to the first solvent.

A layer of this solution, which has a viscosity on the order of 28 Pa/s, is applied to a glass substrate, with a flexible brush, for example.

The average thickness of this layer of photosensitive resin is less than 5 $\mu$m after drying for 30 min at 60° C. Some portions of the photosensitive product obtained in this manner are exposed to light by means of a UV laser with about 1 kW of power, whose beam is deflected point by point by a mirror to reproduce the desired visible image.

A second layer of an enamel composition is then applied uniformly over the entire first layer of photosensitive resin, areas of which have been exposed to light.

To make this composition, first, a cullet-based glass frit of a clear soda-lime-silica glass is reground by the liquid method to yield ultrafine particles.

The particle size of the glass frit has been measured: diameters $d_{10}$, $d_{60}$ and $d_{90}$ are, respectively, 0.2 $\mu$m, 1.25 $\mu$m and 10 $\mu$m.

These finely ground particles are then mixed with titanium oxide $TiO_2$ pigments with diameters $d_{10}$, $d_{60}$ and $d_{90}$ of, respectively, 0.4 $\mu$m, 2 $\mu$m and 7 $\mu$m, in proportions such that the weight ratio between the pigments and the glass frit is 48:52 per 100 parts of frit-pigment mixture.

The composition of the enamel, in proportions by weight, is as follows: 42% PbO, 4.9% ZnO, 1.9% $SiO_2$, 1.4% $ZrO_2$, 0.9% $Al_2O_3$, 0.14% SrO and 48% $TiO_2$.

Finally, the combination of glass frit plus pigments so constituted is mixed with a medium which is alcohol.

Once this second layer of enamel composition has been applied, drying is performed in an oven at 60° C. for 30 seconds, with evacuation of the alcohol vapors.

This is followed by washing in lukewarm water at a temperature on the order of 50° C., accompanied by brushing of the second layer with a soft-bristled brush.

At the time of this washing step, the excess enamel not absorbed by the first layer of photosensitive resin is recovered by being decanted into a container.

Finally, the substrate coated in this way is put through a heat treatment cycle. This is composed of burn-off of the resin at 350° C. for 1 hour, followed by baking of the enamel and quenching of the glass substrate at about 620° C.

The substrate obtained in this manner comprises an enameled area that reproduces a very-high-definition visible monochrome image with resolution of 150 d.p.i. This excellent resolution is directly related to the focusing capacity of the laser beam, and is, in particular, on the order of 10 $\mu$m.

Further, the gray levels in this enameled area have been calibrated arbitrarily from 0 to 21 and the light transmission coefficient of each gray level has been measured. The values are given in the following table:

TABLE

| Gray Level | Light Transmission Coefficient |
| --- | --- |
| 1 | 87.1 |
| 2 | 56.2 |
| 3 | 38.0 |
| 4 | 26.3 |
| 5 | 17.8 |
| 6 | 12.6 |
| 7 | 8.9 |
| 8 | 5.9 |
| 9 | 4.3 |
| 10 | 2.9 |
| 11 | 2.1 |
| 12 | 1.5 |
| 13 | 1.1 |
| 14 | 0.7 |
| 15 | 0.5 |
| 16 | 0.40 |
| 17 | 0.28 |
| 18 | 0.22 |
| 19 | 0.15 |
| 20 | 0.10 |
| 21 | 0.07 |

This table makes it clear that the capacity of the image can be adjusted over a broad range, and thus that it is possible to obtain very marked contrasts.

It goes without saying that many modifications of detail can be made in the method described hereinabove without thereby departing from the scope of the invention.

For example, it is possible to modulate the devitrification of the glass frit in such a way as to produce a color image without the need for pigments.

Similarly, the optional medium used to deposit the enamel composition on the layer of photosensitive resin can be laid down before the deposition of the glass frit particles.

Finally, with regard to selective particle deposition, a second selectivity in addition to that provided by the light source can be furnished by distributing particles uniformly over the entire surface.

What is claimed is:

1. A substrate produced by:
   a) depositing on at least part of a face of a substrate a first layer of a photosensitive resin comprising (i) a sensitizing agent and (ii) at least one photosensitive compound comprising a polymer with an average degree of cross-linking d° such that it is able to absorb solid particles;
   b) exposing an area of said first layer to light to increase the average degree of cross-linking d° of said polymer, wherein the absorption capacity of the polymer is modulated as a function of light exposure;
   c) after exposure, depositing on said first layer a second layer of a composition comprising mineral particles, wherein at least some of the mineral particles are absorbed by the first layer; and
   d) subjecting said substrate to at least one heat treatment cycle, to fix said mineral particles,
   wherein said substrate comprises a pattern having a shading or gradation of color intensity.

2. A high resolution decorative glass comprising a substrate according to claim 1.

3. The substrate of claim 1, wherein said polymer is ethylene-glycol and butanediol polycynamylidene malonate.

4. The substrate of claim 1, wherein the diameter of the mineral particles is less than or equal to the thickness of said first layer.

5. The substrate of claim 4, wherein the diameter of said mineral particles $d_{90}$ is less than or equal to 10 $\mu$m.

6. The substrate of claim 5, wherein the diameter of said mineral particles $d_{90}$ is between 4 and 8 $\mu$m.

7. The substrate of claim 1, wherein said composition comprising mineral particles is an enamel composition comprising at least one glass frit.

8. The substrate of claim 7, wherein said enamel composition also includes pigments.

9. The substrate of claim 8, wherein the particle size of the pigments is about equal to the particle size of the glass frits.

10. The substrate of claim 8, wherein the diameter $d_{90}$ of the pigments is less than 10 $\mu$m.

11. The substrate of claim 10, wherein the diameter $d_{90}$ of the pigments is between 1 and 5 $\mu$m.

12. The substrate of claim 8, wherein the weight ratio between the glass frit and the pigments is between 50:50 and 90:10, per 100 parts of frit-and-pigment mixture.

13. The substrate of claim 12, wherein the weight ratio between the glass frit and the pigments is between 70:30 and 60:40, per 100 parts of frit-and-pigment mixture.

14. The substrate of claim 7, wherein said enamel composition includes mica pigments as its majority constituent.

15. The substrate of claim 1, wherein the mineral particles are uniformly applied to the substrate.

16. The substrate of claim 1, wherein the pattern contains no trace of gridding.

17. The substrate of claim 1, wherein the heat treatment temperature is greater than or equal to the melting temperature of at least a portion of the mineral particles.

* * * * *